United States Patent
Naito

(10) Patent No.: US 7,354,697 B2
(45) Date of Patent: Apr. 8, 2008

(54) PROCESS FOR PRODUCING WIRING CIRCUIT BOARD

(75) Inventor: Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/934,703

(22) Filed: Sep. 7, 2004

(65) Prior Publication Data

US 2005/0053868 A1    Mar. 10, 2005

(30) Foreign Application Priority Data

Sep. 8, 2003    (JP)    .......................... P.2003-315634

(51) Int. Cl.
*G03F 7/26*    (2006.01)

(52) U.S. Cl. ....................... 430/311; 430/961

(58) Field of Classification Search ................ 430/311, 430/313, 314, 319, 317
See application file for complete search history.

(56) References Cited

U.S. PATENT DOCUMENTS

| | | | |
|---|---|---|---|
| 3,883,352 A * | 5/1975 | Kloczewski et al. ........... 29/837 |
| 4,302,268 A | 11/1981 | Tachiki ........................ 156/238 |
| 4,411,982 A | 10/1983 | Shibuya ....................... 430/314 |
| 4,618,567 A | 10/1986 | Sullivan ....................... 430/311 |
| 4,719,495 A | 1/1988 | Ohuchi ......................... 355/100 |
| 5,532,105 A | 7/1996 | Yamadera ..................... 430/156 |

FOREIGN PATENT DOCUMENTS

| | | | |
|---|---|---|---|
| EP | 0 099 426 | | 5/1987 |
| JP | 05-243715 | * | 9/1993 |
| JP | 05-243715 A | | 9/1993 |
| JP | 06 053642 | | 2/1994 |
| JP | 06-310838 | * | 11/1994 |
| JP | 2000-275861 A | | 10/2000 |
| JP | 2003-149804 A | | 5/2003 |

OTHER PUBLICATIONS

European Search Report, dated Apr. 16, 2007.
Japanese Office Action dated Jun. 13, 2006.

* cited by examiner

*Primary Examiner*—Kathleen Duda
(74) *Attorney, Agent, or Firm*—Sughrue Mion, PLLC

(57) ABSTRACT

The invention provides a process for producing a wiring circuit board, which comprises the steps of: (A) forming a conductor layer of a predetermined pattern on an insulating layer; (B) forming a photosensitive solder resist layer on the insulating layer and the patterned conductor layer formed on the insulating layer; (C) disposing a transparent protective film on the photosensitive solder resist layer; and (D) exposing the photosensitive solder resist layer to a light through the transparent protective film.

7 Claims, 4 Drawing Sheets

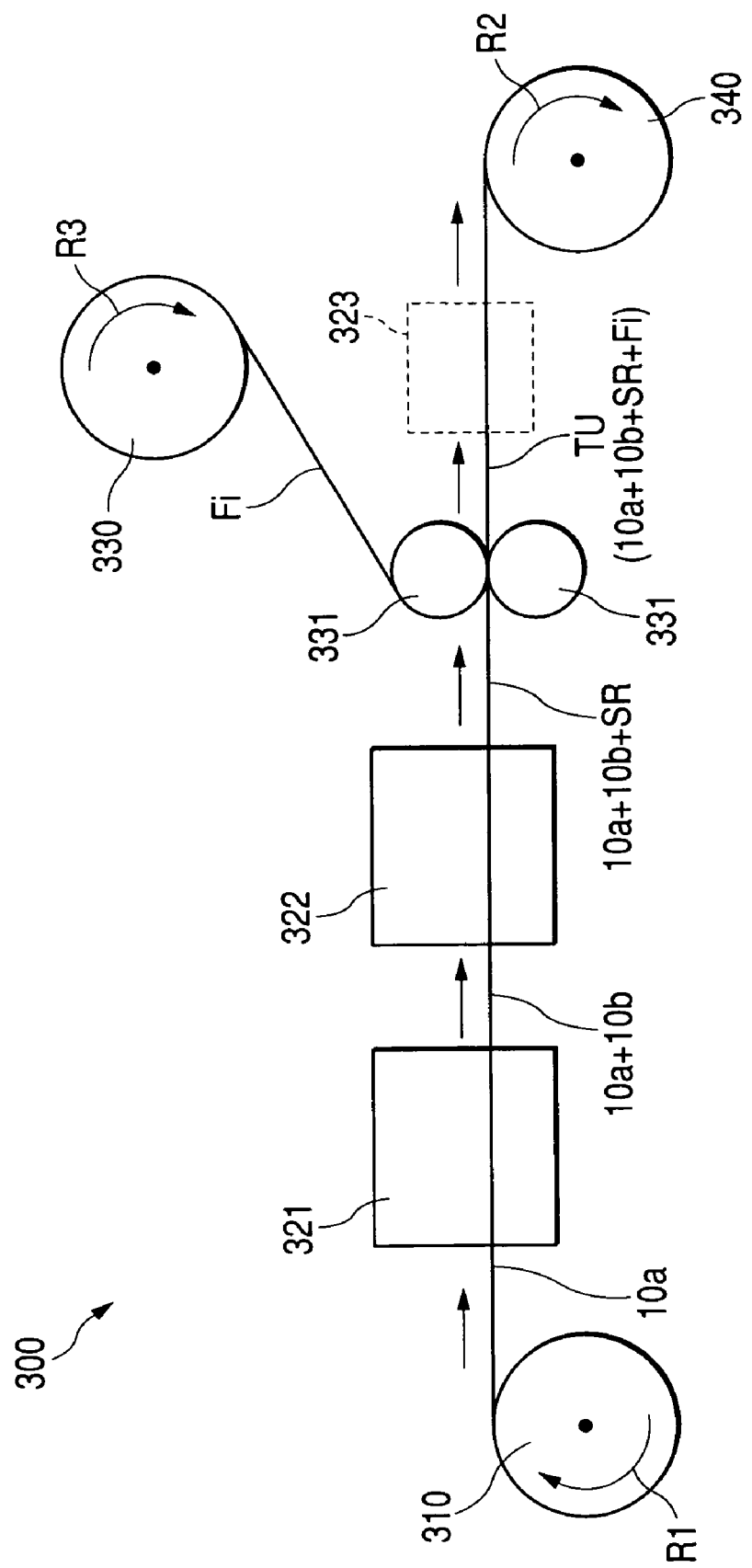

PROCESS FOR PRODUCING WIRING CIRCUIT BOARD

FIELD OF THE INVENTION

The present invention relates to a process for producing a wiring circuit board having a solder resist.

BACKGROUND OF THE INVENTION

In steps for producing wiring circuit boards such as, e.g., flexible wiring circuit boards, a solder resist layer (covering insulating layer) is formed in order to protect the wiring pattern (conductor layer) and prevent solder bridging between connection terminals.

Screen printing has hitherto been used for forming solder resist layers. However, with the trend toward higher wiring pattern densities, photographic techniques capable of coping with finer wiring pitches (smaller spaces between wiring patterns) have recently come to be generally used in place of screen printing.

FIGS. 4 are diagrammatic sectional views illustrating an example of procedures of a conventional process for producing a wiring circuit board.

First, a conductor layer 90b having a predetermined pattern is formed on an insulating layer 90a as shown in FIG. 4(a). Thereafter, a solution of a photosensitive solder resist is applied on the surface of the insulating layer 90a including the conductor layer 90b. The solution of a photosensitive solder resist on the insulating layer 90a is then dried in a circulating hot-air oven to form a photosensitive solder resist layer SR as shown in FIG. 4(b).

Subsequently, as shown in FIG. 4(c), the photosensitive solder resist layer SR is irradiated with ultraviolet ray (UV) through a mask MK having a predetermined pattern. Thus, the photosensitive solder resist layer SR is selectively exposed to the light.

The exposed solder resist layer SR is then developed as shown in FIG. 4(d) to form a photosensitive solder resist layer SR having a predetermined pattern. The photosensitive solder resist layer SR is then subjected to a curing treatment to thereby give a wiring circuit board 900.

In FIG. 4(d), the central conductor layer 90b corresponds to, for example, a wiring part and the other two conductor layers 90b corresponds to, for example, connection terminals.

The photosensitive solder resist generally contains low-molecular ingredients such as, e.g., a polymerization initiator and a sensitizer so as to impart photosensitivity. However, due to the presence of the low-molecular ingredients such as the polymerization initiator and the sensitizer, the unexposed surface of the photosensitive solder resist layer SR has tackiness at room temperature even after drying in a circulating hot-air oven.

Consequently, in the conventional process for producing a wiring circuit board 900, it is impossible, after the drying of the photosensitive solder resist layer SR in a circulating hot-air oven, to stack up cut sheets of the resultant intermediate product or to wind the intermediate product into a roll. This is because if the intermediate product is superposed one on another or wound into a roll, the photosensitive solder resist layer SR, which has tackiness, undesirably adheres to the overlying insulating layer 90a.

On the other hand, in processes for producing a flexible wiring circuit board having flexibility, a roll-to-roll operation is generally conducted frequently.

In the roll-to-roll operation, a long sheet (long sheet substrate) which has been wound around a roller is drawn out from the roller, subjected to predetermined treatments or processings, and then wound around a roller. This operation improves the efficiency of production of flexible wiring circuit boards and can realize a reduction in production cost.

However, if the above-mentioned intermediate product is wound into a roll, the photosensitive solder resist layer SR comes into contact with the insulating layer 90a and hence adheres thereto because the surface of the photosensitive solder resist layer SR has tackiness at ordinary temperature. Therefore, in the case where the above-mentioned photosensitive solder resist layer SR is used, the roll-to-roll operation cannot be conducted.

A technique for overcoming the problem described above has been proposed which comprises applying a release agent, e.g., a silicone resin, on the photosensitive solder resist layer SR to form a coating in order to avoid the tackiness of the photosensitive solder resist layer SR (see, for example, patent document 1 specified below).

In this case, even when the photosensitive solder resist layer SR comes into contact with the insulating layer 10a, the two layers are easily separated from each other by virtue of the release agent.

Patent Document 1: JP 05-243715A

However, the technique in which a coating film of a release agent, e.g., a silicone resin, is formed on the photosensitive solder resist layer SR has a drawback that there are cases where the application of the release agent on the photosensitive solder resist layer SR gives coating unevenness. Since the photosensitive solder resist layer SR is exposed to light through the release agent, the coating unevenness causes, in the exposure shown in FIG. 4(c), the photosensitive solder resist layer SR to suffer exposure unevenness. As a result, the exposed solder resist layer SR comes to have, for example, dissolution rate unevenness with respect to the developing solution in the development step thereof. There are hence cases where the resultant solder resist layer SR has thickness unevenness.

Furthermore, there are cases where uneven application of the release agent results in insufficient drying of the release agent itself and this results in sticking in intermediate product superposition.

In addition, since a coating operation and a drying operation each should be conducted twice, a large and expensive apparatus is necessary in the case where a continuous processing operation is to be conducted with a coating machine comprising the corresponding film coaters and dryers. Use of such an apparatus undesirably results in increased production cost.

SUMMARY OF THE INVENTION

An object of the invention is to provide a process for wiring circuit board production by which a wiring circuit board having high reliability can be produced at low cost.

Other objects and effects of the invention will become apparent from the following description.

The invention provides a process for producing a wiring circuit board which comprises the steps of:

(A) forming a conductor layer of a predetermined pattern on an insulating layer;

(B) forming a photosensitive solder resist layer on the insulating layer and the patterned conductor layer formed on the insulating layer;

(C) disposing a transparent protective film on the photosensitive solder resist layer; and (D) exposing the photosensitive solder resist layer to a light through the transparent protective film.

In the process of the invention for producing a wiring circuit board, a transparent protective film is disposed on a photosensitive solder resist layer. Namely, the photosensitive solder resist layer is covered with the transparent protective film. Because of this, even when intermediate products in which the photosensitive solder resist layer has not undergone a curing treatment are stacked up, the photosensitive solder resist layer of the underlying intermediate product is prevented from sticking to the insulating layer of the overlying intermediate product. In this case, the term "intermediate product" means a multilayered structure comprising an insulating layer, a conductor layer, a photosensitive (or exposed) solder resist layer, and a transparent protective film.

Furthermore, since the transparent protective film is evenly disposed on the photosensitive solder resist layer, the transparent protective film does not cause exposure unevenness when the photosensitive solder resist layer is exposed to light. Consequently, even when the conductor layer has a finer pattern, the exposure of the photosensitive solder resist layer can be conducted with satisfactory precision. As a result, a wiring circuit board having high reliability can be produced.

The process may further comprises:

(E) peeling the transparent protective film from the exposed solder resist layer; and (F) developing the exposed solder resist layer.

In this case, the transparent protective film is peeled from the exposed solder resist layer and the exposed solder resist layer is then developed. As a result, a solder resist layer having a predetermined pattern can be formed.

The insulating layer and the transparent protective film each may be a long sheet and the process may further comprise, after the above step (C) or (D), winding a long sheet-shaped multilayered structure comprising the insulating layer, the conductor layer, the photosensitive or exposed solder resist layer and the transparent protective film into a roll.

In this case, the long sheet-shaped multilayered structure comprising the insulating layer in a long sheet form, conductor layer, photosensitive solder resist layer and transparent protective film is wound into a roll after the transparent protective film-disposing step (C) or after the photosensitive solder resist layer-exposing step (D)

This embodiment improves the efficiency of wiring circuit board production and attains a reduction in the cost of wiring circuit boards.

The process may further comprise preparing a roll of a long sheet-shaped substrate comprising an insulating layer, optionally having thereon a conductor layer, so that the steps (A) to (C) are successively carried out with respect to the long sheet-shaped substrate drawn out from the roll thereof.

In this case, a roll of a long sheet-shaped substrate comprising an insulating layer, optionally having thereon a conductor layer is prepared first. The long sheet-shaped substrate is drawn out from the roll and subjected successively to the patterned conductor layer-forming step (A), the photosensitive solder resist layer-forming step (B), and the transparent protective film-disposing step (C). As a result, the efficiency of wiring circuit board production is improved and a reduction in the cost of wiring circuit boards is attained.

In the process of the invention for producing a wiring circuit board, a transparent protective film is disposed on a photosensitive solder resist layer. Namely, the photosensitive solder resist layer is covered with a transparent protective film. Therefore, even when intermediate products in which the photosensitive solder resist layer has not undergone a curing treatment are stacked up, the photosensitive solder resist layer of the underlying intermediate product is prevented from sticking to the insulating layer of the overlying intermediate product. In this case, the term "intermediate product" means a multilayered structure comprising an insulating layer, a conductor layer, a photosensitive (or exposed) solder resist layer, and a transparent protective film.

Furthermore, since the transparent protective film is evenly disposed on the photosensitive solder resist layer, the transparent protective film does not cause exposure unevenness when the photosensitive solder resist layer is exposed to light. Consequently, even when the conductor layer has a finer pattern, the exposure of the photosensitive solder resist layer can be conducted with satisfactory precision. As a result, a wiring circuit board having high reliability can be produced.

BRIEF DESCRIPTION OF THE DRAWINGS

FIG. 3 is a diagrammatic view illustrating an example of the apparatus for producing a flexible wiring circuit board by a roll-to-roll operation according to one embodiment of the invention.

Figure 1A:
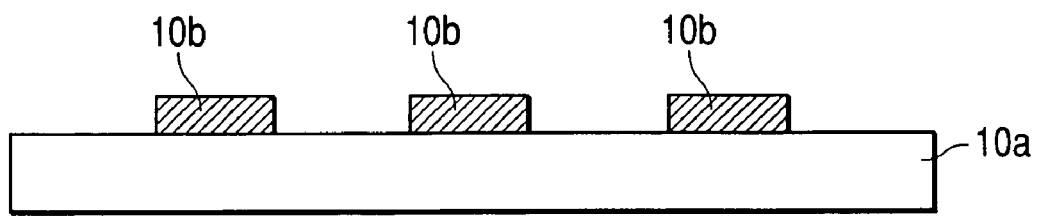
FIGS. 1(a) to 1(c) are diagrammatic sectional views illustrating steps of one embodiment of the process for producing a flexible wiring circuit board of the invention.

The reference numerals and signs used in the drawings denote the followings, respectively.

10a: Insulating layer
10b: Conductor layer
300: Roll-to-roll apparatus
310: Unwinding roller
321: Conductor layer-forming device
322: Solder resist-coating device
323: Exposing device
330: Film-feeding roller
331: Laminating roller
340: Wind-up roller
SR: Photosensitive solder resist layer
Fi: Transparent protective film
TU: Intermediate sheet

DETAILED DESCRIPTION OF THE INVENTION

One embodiment of the process for producing a flexible wiring circuit board according to the invention will be explained below by reference to FIGS. 1 to 3.

FIGS. 1 and 2 are diagrammatic sectional views illustrating steps of one embodiment of the process for producing a flexible wiring circuit board of the invention.

First, a conductor layer 10b having a predetermined pattern is formed on an insulating layer 10a as shown in FIG. 1(a) (conductor layer formation). Thus, a wiring pattern of the conductor layer 10b is formed. For forming the patterned conductor layer 10b, any of the subtractive method, semi-additive method, and additive method may be used.

The subtractive method is a technique in which a conductor layer is formed beforehand and unnecessary parts of the conductor layer are removed by etching to thereby form a conductor layer 10b having a predetermined pattern. The additive method is a technique in which a conductor layer 10b having a predetermined pattern is formed through deposition by, e.g., plating. The semi-additive method is a technique comprising a combination of the subtractive method and the additive method.

The insulating layer 10a is not particularly limited as long as it has flexibility and electrical insulating properties. However, the insulating layer 10a preferably is made of, e.g., a polyimide, which has chemical resistance and heat resistance. The thickness of the insulating layer 10a is preferably in the range of 5-100 μm, more preferably 10-30 μm.

The insulating layer 10a is preferably a long sheet (long sheet-shaped substrate). In the case where the insulating layer 10a is a long sheet, it is preferred to conduct a roll-to-roll operation. In the roll-to-roll operation, the long sheet which has been wound around a roller is drawn out from the roller, subjected to predetermined treatments or processings, and then wound around a roller. This roll-to-roll operation will be described later in detail.

The conductor layer 10b is not particularly limited as long as it has electrical conductivity. However, the conductor layer 10b is preferably made of copper. The thickness of the conductor layer 10b is preferably in the range of 3-50 μm, more preferably 5-20 μm.

Figure 1B:
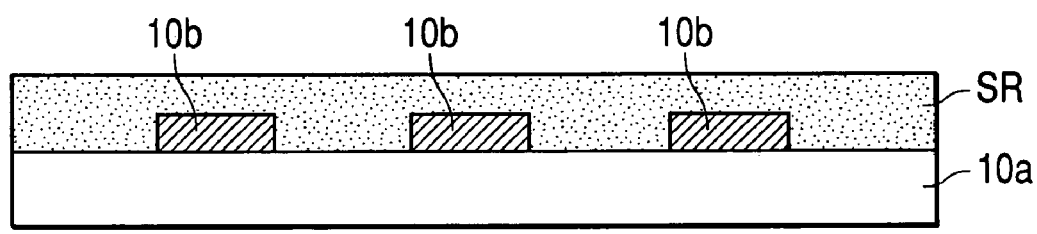

Subsequently, a solution of a photosensitive solder resist is applied on the surface of the insulating layer 10a including the conductor layer 10b (solder resist application). The applied photosensitive solder resist solution is then dried in, e.g., a circulating hot-air oven. Thus, a photosensitive solder resist layer SR is formed over the insulating layer 10a as shown in FIG. 1(b). The surface of this photosensitive solder resist layer SR has tackiness even after the drying.

The material of the photosensitive solder resist is not particularly limited. Typical examples thereof include materials such as acrylic, urethane, epoxy, and polyimide materials. Any of these may be used. Such a photosensitive solder resist is dissolved in a solvent to prepare a solution.

The drying of the photosensitive solder resist solution applied on the surface of the insulating layer 10a is preferably conducted at a temperature of 60-100° C.

The thickness of the photosensitive solder resist layer SR is preferably in the range of 3-50 μm, more preferably 5-30 μm, most preferably 8-20 μm.

Figure 1C:
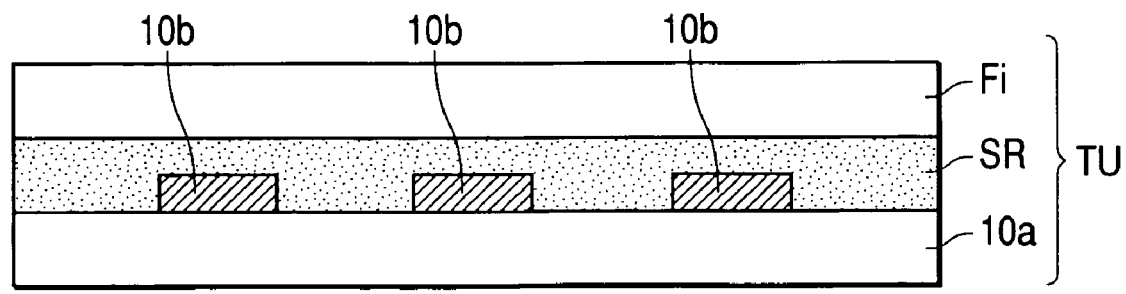

Thereafter, as shown in FIG. 1(c), a transparent protective film Fi in a sheet form is superposed on the photosensitive solder resist layer SR (superposition of transparent protective film). Thus, an intermediate sheet TU which comprises the insulating layer 10a, conductor layer 10b, photosensitive solder resist layer SR and transparent protective film Fi is produced. In this embodiment, the superposition of the transparent protective film Fi on the photosensitive solder resist layer SR is conducted, for example, by the roll-to-roll operation which will be described later. However, methods for the superposition are not limited thereto.

The transparent protective film Fi is not particularly limited as long as it is capable of transmitting a light having a wavelength to which the photosensitive solder resist layer SR has a sensitivity. With respect to the light transmittance, the transparent protective film Fi preferably has such a light transmittance that it transmits at least 80% of a light having a wavelength in the range of 100-800 nm. More preferably, the transparent protective film Fi has such a light transmittance that it transmits at least 80% of a light having a wavelength in the range of 350-450 nm.

Furthermore, the transparent protective film Fi preferably has high light transmittance especially to lights having wavelengths of i-line (365 nm), h-line (405 nm), and g-line (436 nm).

When the transparent protective film Fi has such transmission characteristics, a light necessary for allowing the photosensitive solder resist layer SR to photoreact, e.g., ultraviolet ray (wavelength, about 1-400 nm), passes through the transparent protective layer. The photosensitive solder resist layer SR can hence be easily allowed to photoreact, and exposure can be satisfactorily conducted.

Examples of the material of the transparent protective film Fi include polyethylene and polyesters. In the case where a polyester is used as the material of the transparent protective film Fi, a cost reduction is realized because polyesters are inexpensive.

In the case where polyethylene is used as the material of the transparent protective film Fi, air bubble inclusion is less apt to occur in superposing the protective film Fi on the photosensitive solder resist layer SR because polyethylene is flexible and well conforms to the surface irregularities due to the conductor layer 10b of a predetermined pattern. Use of polyethylene hence enables exposure to be satisfactorily conducted.

The thickness of the transparent protective film Fi is preferably in the range of 5-50 μm, more preferably 10-30 μm.

In this embodiment, when intermediate sheets TU in which the photosensitive solder resist layer SR has not undergone the curing treatment described later are stacked up, then the photosensitive solder resist layer SR, which has tackiness, is prevented from sticking to the insulating layer 10a because the transparent protective film Fi is superposed on the photosensitive solder resist layer SR.

Figure 2D:
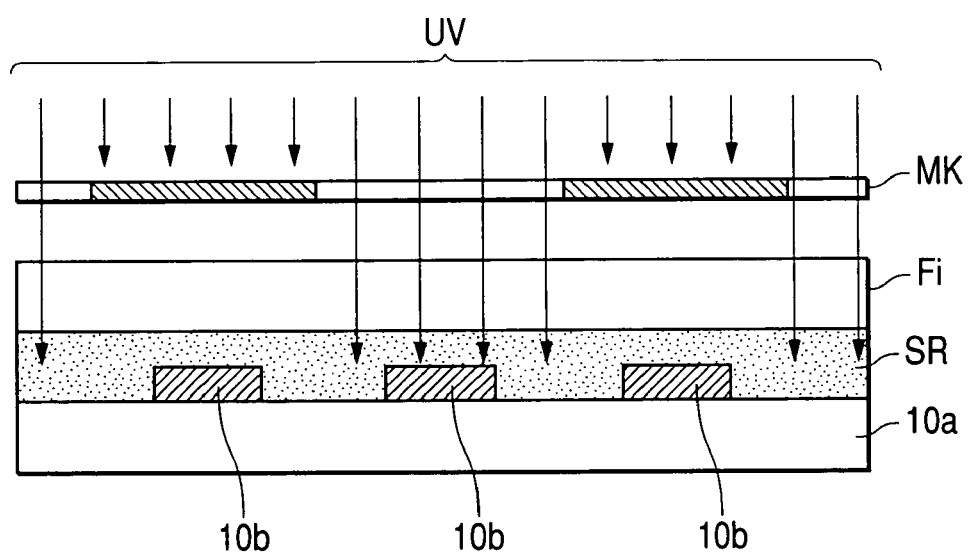
FIGS. 2(d) to 2(e) are diagrammatic sectional views illustrating steps of the embodiment of the process for producing a flexible wiring circuit board of the invention.

Subsequently, as shown in FIG. 2(d), the photosensitive solder resist layer SR is irradiated with ultraviolet ray UV through a mask MK having a predetermined pattern (solder resist exposure), thereby being selectively exposed to the ultraviolet ray UV through the transparent protective film Fi.

Referring to conditions for this exposure, the exposure amount (irradiation energy per unit area) is preferably 100-800 mJ/cm². The exposure period is appropriately controlled according to the temperature, properties of the photosensitive solder resist layer SR, the wavelength of the ultraviolet ray UV to be used for irradiation, etc. Thus, the photosensitive solder resist layer SR is allowed to photoreact in accordance with the predetermined pattern of the mask MK.

Thereafter, the transparent protective film Fi on the exposed solder resist layer SR is peeled off (peeling of transparent protective film).

The exposed solder resist layer SR is immersed in a developing solution, whereby the exposed solder resist layer SR is developed to form a predetermined pattern corresponding to the mask MK (solder resist development).

As the developing solution, there can be used an aqueous alkali solution in general use, such as, e.g., an aqueous solution of sodium carbonate, sodium hydroxide, or potassium hydroxide. The concentration of the developing solution is preferably in the range of, e.g., 0.3-5%. The temperature for the development is preferably in the range of 20-60° C.

Figure 2E:
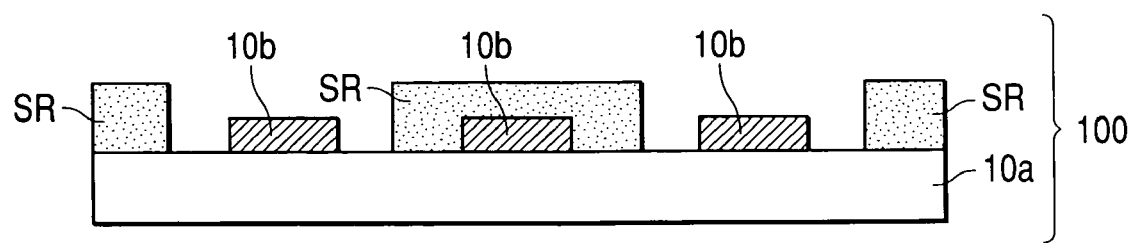
Figure 4A:
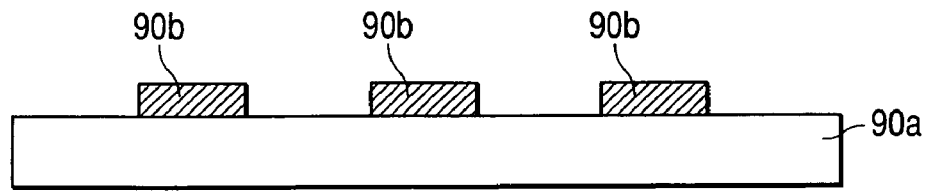
FIGS. 4(a) to 4(d) are diagrammatic sectional views illustrating an example of procedures of the conventional process for producing a wiring circuit board.
Figure 4B:
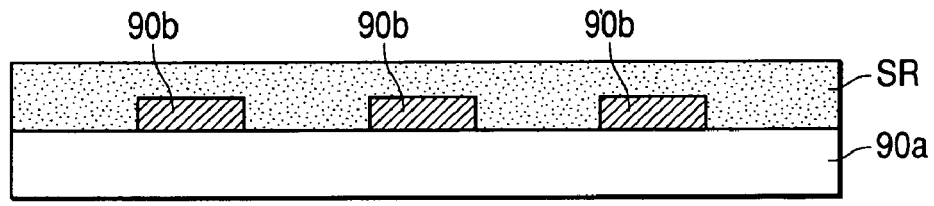
Figure 4C:
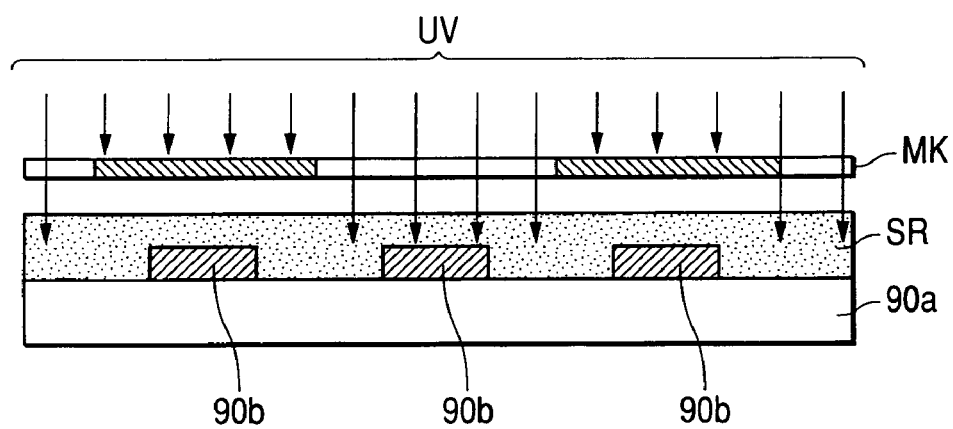
Figure 4D:
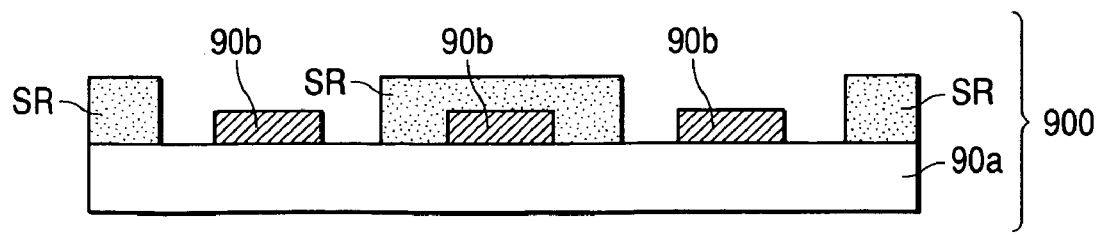

Finally, the developed solder resist layer SR is heated (solder resist curing). By heating, the exposed solder resist layer SR undergoes a curing reaction and its tackiness disappears. Thus, a flexible wiring circuit board 100 according to this embodiment is completed as shown in FIG. 2(e). The temperature for heating the developed solder resist layer SR is preferably in the range of 120-200° C.

In FIG. 2(e), the central conductor layer 10b corresponds, for example, to a wiring part and the other two conductor layers 10b corresponds, for example, to connection terminals.

An explanation is then given on the roll-to-roll operation. FIG. 3 is a diagrammatic view illustrating an example of the apparatus usable for producing a flexible wiring circuit board 100 by a roll-to-roll operation according to this embodiment. Hereinafter, the apparatus shown in FIG. 3 is referred to as a roll-to-roll apparatus.

With the roll-to-roll apparatus 300 shown in FIG. 3, the conductor layer formation, solder resist application, and superposition of transparent protective film described above are conducted. The solder resist exposure may be further conducted as needed.

The roll-to-roll apparatus 300 comprises a conductor layer-forming device 321, a solder resist-coating device 322, an unwinding roller 310, a film-feeding roller 330, a pair of laminating rollers 331, and a wind-up roller 340. In the case where the solder resist exposure is conducted in the roll-to-roll apparatus 300, an exposing device 323 (indicated by the broken lines in FIG. 3) is also included in the constitution of the apparatus.

Around the unwinding roller 310 in FIG. 3, there has been wound a long sheet-shaped insulating layer 10a The unwinding roller 310 rotates in the direction indicated by the arrow R1 (the direction opposite to the direction of winding of the insulating layer 10a). The insulating layer 10a is drawn out as a result of the rotation, passes through the conductor layer-forming device 321, solder resist-coating device 322, and pair of laminating rollers 331, and is then sent to the wind-up roller 340. This wind-up roller 340 rotates in the direction indicated by the arrow R2 (the same direction as that indicated by R1). As a result, the insulating layer 10a on which various layers have been formed is wound around the wind-up roller 340.

In the conductor layer-forming device 321, the conductor layer formation is conducted. As a result, a conductor layer 10b of a predetermined pattern is formed on the insulating layer 10a. The insulating layer 10a on which the patterned conductor layer 10b has been formed is then sent to the solder resist-coating device 322.

In the solder resist-coating device 322, the solder resist application is conducted. Here, a solution of a photosensitive solder resist is applied on the surface of the insulating layer 10a including the conductor layer 10b, and the photosensitive solder resist applied is dried. As a result, a photosensitive solder resist layer SR is formed. The insulating layer 10a over which the photosensitive solder resist layer SR has been formed is then sent to the pair of laminating rollers 331.

Around the film-feeding roller 330, there has been wound a transparent protective film Fi. The film-feeding roller 330 rotates in the direction indicated by the arrow R3 to thereby feed the transparent protective film Fi to one of the pair of laminating rollers 331.

At the pair of laminating rollers 331, the superposition of the transparent protective film is conducted. In this processing, the transparent protective film Fi is laminated to the photosensitive solder resist layer SR formed by the solder resist-coating device 322. As a result, an intermediate sheet TU comprising the insulating layer 10a, conductor layer 10b, photosensitive solder resist layer SR, and transparent protective film Fi as shown in FIG. 1(c) is formed. This intermediate sheet TU is wound around the wind-up roller 340.

In the case where the solder resist exposure is conducted in the roll-to-roll apparatus 300, the intermediate sheet TU is sent from the laminating rollers 331 to the exposing device 323. The intermediate sheet TU sent to the exposing device 323 is subjected to the solder resist exposure. The intermediate sheet TU which has undergone the solder resist exposure is sent to the wind-up roller 340 and wound around the wind-up roller 340.

As described above, in the roll-to-roll apparatus 300, various treatments or processings are successively conducted during when the long sheet-shaped insulating layer 10a is sent from the unwinding roller 310 to the wind-up roller 340. Consequently, the roll-to-roll operation not only improves the efficiency of wiring circuit board production but also attains a reduction in the cost of wiring circuit boards.

In the foregoing embodiment, the formation of conductor layer, solder resist application, and superposition of a transparent protective film are conducted through a roll-to-roll operation using the roll-to-roll apparatus 300 shown in FIG. 3. However, it is also possible to use another roll-to-roll apparatus so as to subject the intermediate sheet TU wound around the wind-up roller 340 to solder resist exposure, peeling of the transparent protective film, solder resist development, and solder resist curing through a roll-to-roll operation. This process further improves the efficiency of wiring circuit board production and attains a further reduction in the cost of wiring circuit boards.

In the foregoing embodiment, a roll-to-roll operation is made possible by superposition of the transparent protective film Fi on the photosensitive (or exposed) solder resist layer SR having tackiness. Consequently, according to this embodiment of the process for producing a flexible wiring circuit board 100, a high production efficiency and a cost reduction can be attained.

Furthermore, because a transparent protective film Fi in a sheet form is used, the transparent protective film Fi can be evenly superposed on the photosensitive solder resist layer SR. As a result, the transparent protective film Fi does not cause exposure unevenness when the solder resist layer is exposed to light and, hence, development unevenness does not occur during the solder resist development. Consequently, even when the conductor layer has a finer wiring pattern, a solder resist layer SR can be formed with satisfactory precision.

In the foregoing embodiment, the insulating layer 10a, conductor layer 10b, and photosensitive solder resist layer SR correspond to the insulating layer, conductor layer, and photosensitive solder resist layer, respectively.

Further, the transparent protective film Fi, intermediate sheet TU, insulating layer 10a, and unwinding roller 310 correspond to the transparent protective film, long sheet-shaped multilayered structure, long sheet-shaped insulating layer substrate, and roller, respectively.

EXAMPLES

The present invention will be illustrated in greater detail with reference to the following Examples, but the invention should not be construed as being limited thereto.

A flexible wiring circuit board 100 was produced in accordance with the foregoing embodiment of the process for producing a flexible wiring circuit board 100. The procedure for production is as follows.

First, a long sheet-shaped two-layer substrate composed of a 25 μm-thick polyimide and a 12 μm-thick copper foil directly formed thereon (Espanex, manufactured by Nippon Steel Chemical Co., Ltd.) was prepared. This two-layer sheet substrate was wound into a roll.

In this Example, the polyimide corresponds to the insulating layer 10a in FIGS. 1 and the copper foil (after being patterned) corresponds to the conductor layer 10b in FIGS. 1.

The following procedure comprises successive processings conducted by a continuous roll-to-roll operation.

The copper foil of the two-layer sheet substrate was etched so as to result in a predetermined pattern in order to obtain a conductor layer lob of the predetermined pattern (subtractive method). Thus, a conductor layer 10b of the predetermined pattern was formed.

Subsequently, a photosensitive solder resist solution (NPR-80, manufactured by Nippon Polytech Corp.) was applied on the surface of the polyimide (insulating layer 10a) including the patterned copper foil (conductor layer 10b) in such an amount as to give a coating thickness of 20 μm. This application of the solution was conducted with a coating device 322. Thereafter, the coating was continuously dried in a drying oven. The drying was conducted in an 80° C. atmosphere. Thus, a photosensitive solder resist layer SR having tackiness was formed. The drying oven was located downstream from the coating device 322 in FIG. 3.

A polyester film having a thickness of 16 μm (HTF01, manufactured by Teijin Ltd.; thickness, 16 μm) was laminated onto the photosensitive solder resist layer SR with laminating rollers 331. This polyester film corresponds to the transparent protective film Fi in FIG. 1(c). The polyester film had a light transmittance of about 87% as measured at a wavelength of 408 nm.

The resultant intermediate sheet UV composed of the two-layer substrate, photosensitive solder resist layer SR, and polyester film was wound by a wind-up roller 340.

Subsequently, the polyester film and photosensitive solder resist layer SR of the wound intermediate sheet TU were irradiated with a light having a wavelength of 365 nm through a mask having a predetermined pattern. Thus, a series of successive processings was completed.

Thereafter, the polyester film was peeled from the wound intermediate sheet TU, and the exposed solder resist layer SR was developed with a developing solution. This development was conducted with a 0.7% aqueous sodium carbonate solution having a temperature of 25° C.

Finally, the developed solder resist layer SR was subjected to a curing treatment. In this curing treatment, the solder resist layer SR was heated in a 150° C. atmosphere for 60 minutes. Thus, a flexible wiring circuit board 100 according to the Example was obtained.

In this Example described above, a polyester film (transparent protective film Fi) was laminated to the photosensitive solder resist layer SR, which had tackiness. Because of this, when the intermediate sheet TU was wound into a roll, the photosensitive solder resist layer SR which had not undergone a curing treatment did not adhere to the polyimide (insulating layer 10a). As a result, after the formation of the photosensitive solder resist layer SR, the exposure, development, and curing treatment of the solder resist could be conducted smoothly.

The invention is useful in producing a wiring circuit board having a solder resist.

While the present invention has been described in detail and with reference to specific embodiments thereof, it will be apparent to one skilled in the art that various changes and modifications can be made therein without departing from the spirit and scope thereof.

This application is based on Japanese patent application No. 2003-315634 filed Sep. 8, 2003, the contents thereof being herein incorporated by reference.

What is claimed is:

1. A process for producing a wiring circuit board, which comprises the sequential steps of:
   (A) forming a conductor layer of a predetermined pattern on a long sheet insulating layer;
   (B) applying a photosensitive solder resist solution to form a photosensitive solder resist layer on the insulating layer and the patterned conductor layer formed on the insulating layer;
   (C) disposing a long sheet transparent protective film in a sheet form on the photosensitive solder resist layer;
   (D) exposing the photosensitive solder resist layer to a light through the transparent protective film;
   (E) winding a long sheet-shaped multilayered structure comprising the insulating layer, the conductor layer, the photosensitive or exposed solder resist layer and the transparent protective film, into a roll.

2. The process of claim 1, which further comprises, after unwinding te roll,
   (F) peeling the transparent protective film from the exposed solder resist layer; and
   (G) developing the exposed solder resist layer.

3. The process of claim 1, wherein the process further comprises preparing a roll of a long sheet-shaped substrate comprising an insulating layer, optionally having thereon a conductor layer, and
   wherein at least the steps (A) to (C) are successively carried out with respect to the long sheet-shaped substrate drawn out from the roll thereof.

4. The process of claim 3, wherein the steps (A) to (D) are successively carried out with respect to the long sheet-shaped substrate drawn out from the roll thereof.

5. The process of claim 1, wherein the transparent protective film has a thickness of 5 to 50 μm.

6. The process of claim 1, wherein the transparent protective film has a light transmittance of at least 80% with respect to a light having a wavelength in the range of 100-800 nm.

7. The process of claim 1, wherein the transparent protective film comprises at least one of polyethylene and polyester.

* * * * *